(12) United States Patent
Gill

(10) Patent No.: US 7,532,442 B2
(45) Date of Patent: May 12, 2009

(54) MAGNETORESISTIVE (MR) ELEMENTS HAVING PINNING LAYERS FORMED FROM PERMANENT MAGNETIC MATERIAL

(75) Inventor: Hardayal S. Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 543 days.

(21) Appl. No.: 11/230,184

(22) Filed: Sep. 19, 2005

(65) Prior Publication Data

US 2007/0064352 A1    Mar. 22, 2007

(51) Int. Cl.
*G11B 5/39* (2006.01)
(52) U.S. Cl. .............................. 360/324.11; 360/324.12
(58) Field of Classification Search .... 360/324.1–324.2
See application file for complete search history.

(56) References Cited

U.S. PATENT DOCUMENTS

| | | | |
|---|---|---|---|
| 6,146,776 A | 11/2000 | Fukuzawa et al. | |
| 6,483,674 B1 | 11/2002 | Kanai et al. | |
| 6,735,058 B2 | 5/2004 | Lin et al. | |
| 6,816,347 B2* | 11/2004 | Koi et al. | 360/324.11 |
| 7,436,638 B1* | 10/2008 | Pan | 360/324.11 |
| 2003/0206379 A1 | 11/2003 | Lin et al. | |
| 2004/0008455 A1 | 1/2004 | Hasegawa et al. | |
| 2004/0042126 A1 | 3/2004 | Watanabe et al. | |
| 2004/0145836 A1 | 7/2004 | Kojima et al. | |
| 2004/0218311 A1* | 11/2004 | Saito et al. | 360/314 |

FOREIGN PATENT DOCUMENTS

JP    09-097409    8/1997

* cited by examiner

*Primary Examiner*—A. J. Heinz
(74) *Attorney, Agent, or Firm*—Duft Bornsen & Fishman, LLP

(57) ABSTRACT

Magnetoresistive (MR) elements having pinning layers formed from a permanent magnetic material are disclosed. An MR element of the invention includes a first pinning layer, a first pinned layer, a first spacer/barrier layer, a free layer, a second spacer/barrier layer, a second pinned layer, and a second pinning layer. One of the first pinning layer or the second pinning layer is formed from a permanent magnetic material, such as CoPt or CoPtCr. The other of the first pinning layer or the second pinning layer is formed from an antiferromagnetic (AFM) material, such as IrMn or PtMn.

32 Claims, 4 Drawing Sheets

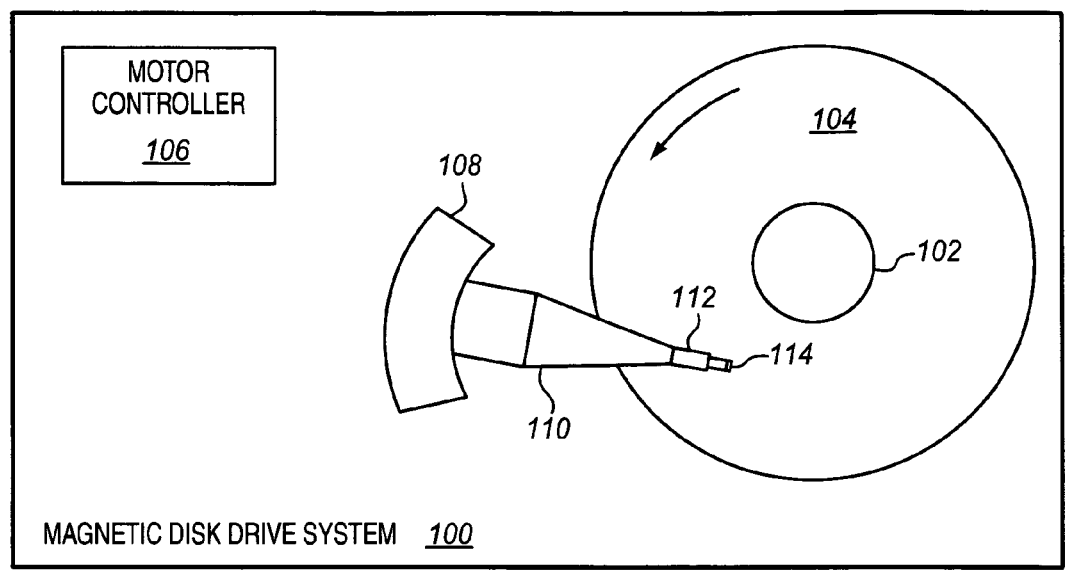
FIG. 1
FIG. 2
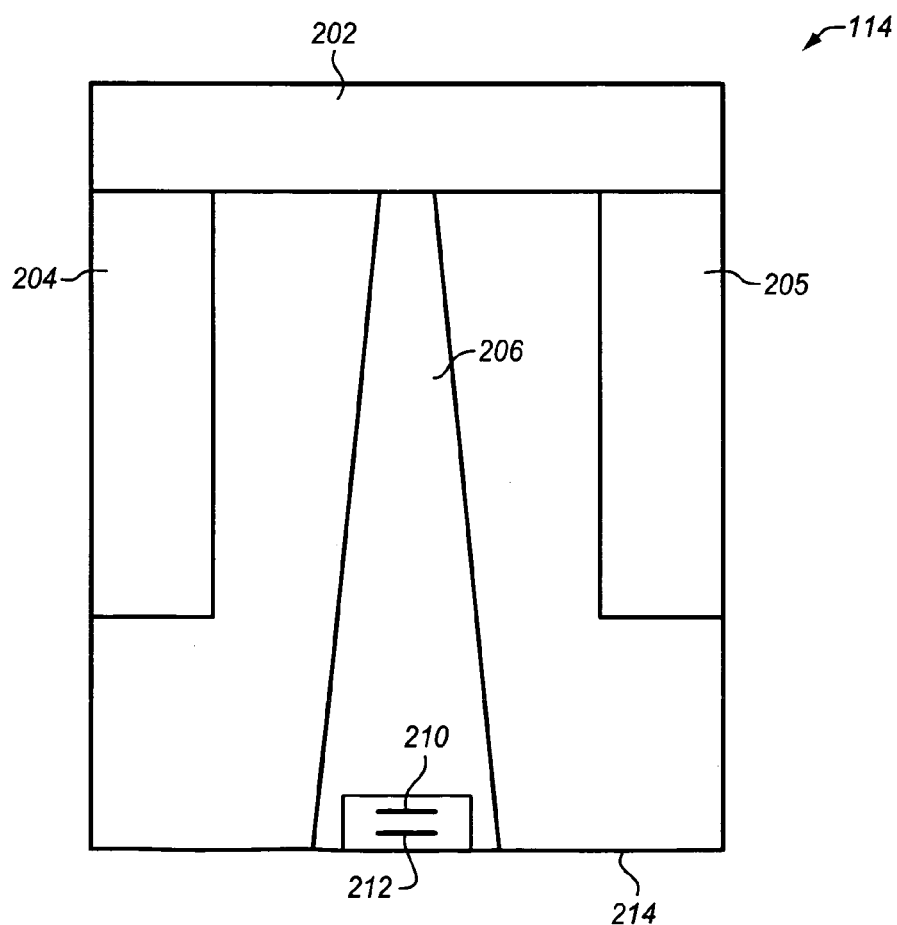

MAGNETORESISTIVE (MR) ELEMENTS HAVING PINNING LAYERS FORMED FROM PERMANENT MAGNETIC MATERIAL

BACKGROUND OF THE INVENTION

1. Field of the Invention

The invention is related to the field of magnetoresistive (MR) elements and, in particular, to MR elements having pinning layers formed from permanent magnetic material.

2. Statement of the Problem

Many computer systems use magnetic disk drives for mass storage of information. Magnetic disk drives typically include one or more recording heads (sometimes referred to as sliders) that include read elements and write elements. A suspension arm holds the recording head above a magnetic disk. When the magnetic disk rotates, an air flow generated by the rotation of the magnetic disk causes an air bearing surface (ABS) side of the recording head to ride a particular height above the magnetic disk. The height depends on the shape of the ABS. As the recording head rides on the air bearing, an actuator moves an actuator arm that is connected to the suspension arm to position the read element and the write element over selected tracks of the magnetic disk.

To read data from the magnetic disk, transitions on a track of the magnetic disk create magnetic fields. As the read element passes over the transitions, the magnetic fields of the transitions modulate the resistance of the read element. The change in resistance of the read element is detected by passing a sense current through the read element and then measuring the change in voltage across the read element. The resulting signal is used to recover the data encoded on the track of the magnetic disk.

The most common type of read elements are magneto resistive (MR) read elements. One type of MR read element is a Giant MR (GMR) read element. GMR read elements using only two layers of ferromagnetic material (e.g., NiFe) separated by a layer of nonmagnetic material (e.g., Cu) are generally referred to as spin valve (SV) elements. A simple-pinned SV read element generally includes an antiferromagnetic (AFM) layer, a first ferromagnetic layer, a spacer layer, and a second ferromagnetic layer. The first ferromagnetic layer (referred to as the pinned layer) has its magnetization typically fixed (pinned) by exchange coupling with the AFM layer (referred to as the pinning layer). The pinning layer generally fixes the magnetic moment of the pinned layer perpendicular to the ABS of the recording head. The magnetization of the second ferromagnetic layer, referred to as a free layer, is not fixed and is free to rotate in response to the magnetic field from the magnetic disk. The magnetic moment of the free layer is free to rotate upwardly and downwardly with respect to the ABS in response to positive and negative magnetic fields from the rotating magnetic disk. The free layer is separated from the pinned layer by the nonmagnetic spacer layer.

Another type of SV read element is an antiparallel pinned (AP) SV read element. The AP-pinned spin valve read element differs from the simple pinned SV read element in that an AP-pinned structure has multiple thin film layers forming the pinned layer instead of a single pinned layer. The AP-pinned structure has an antiparallel coupling (APC) layer between first and second ferromagnetic pinned layers. The first pinned layer has a magnetization oriented in a first direction perpendicular to the ABS by exchange coupling with the AFM pinning layer. The second pinned layer is antiparallel exchange coupled with the first pinned layer because of the selected thickness of the APC layer between the first and second pinned layers. Accordingly, the magnetization of the second pinned layer is oriented in a second direction that is antiparallel to the direction of the magnetization of the first pinned layer.

Another type of MR read element is a Magnetic Tunnel Junction (MTJ) read element. The MTJ read element comprises first and second ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ read element, the first ferromagnetic layer has its magnetic moment pinned (referred to as the pinned layer). The second ferromagnetic layer has its magnetic moment free to rotate in response to an external magnetic field from the magnetic disk (referred to as the free layer). When a sense current is applied, the resistance of the MTJ read element is a function of the tunneling current across the insulating layer between the ferromagnetic layers. The tunneling current flows perpendicularly through the tunnel barrier layer, and depends on the relative magnetization directions of the two ferromagnetic layers. A change of direction of magnetization of the free layer causes a change in resistance of the MTJ read element, which is reflected in voltage across the MTJ read element.

GMR read elements and MTJ read elements may be current in plane (CIP) read elements or current perpendicular to the planes (CPP) read elements. Read elements have first and second leads for conducting a sense current through the read element. If the sense current is applied parallel to the major planes of the layers of the read element, then the read element is termed a CIP read element. If the sense current is applied perpendicular to the major planes of the layers of the read element, then the read element is termed a CPP read element.

Designers of read elements use different techniques to stabilize the magnetic moment of the free layer. Although the magnetic moment of the free layer is free to rotate upwardly or downwardly with respect to the ABS in response to positive and negative magnetic fields from the magnetic disk, it is important to longitudinally bias the free layer (biased parallel to the ABS and parallel to the major planes of the layers of the read element) to avoid unwanted movement or jitter of the magnetic moment of the free layer. Unwanted movement of the magnetic moment adds noise and unwanted frequencies to the signals read from the read element.

One method used to stabilize the magnetic moment of the free layer is to bias the free layer using first and second hard bias magnetic layers that are adjacent to first and second sides of the read element. There are multiple problems with this configuration. First, because the hard bias magnetic layers are on either side of the read element, side shields cannot be inserted on either side of the free layer of the read element. Secondly, the hard bias magnetic layers are insulated from the free layer and the rest of the read element. The insulation and the gap between the magnetic layers and free layer reduce the magnetic field applied to the free layer from the magnetic layers. The reduced magnetic field can provide for weak biasing of the magnetic moment of the free layer. Third, the hard bias magnetic layers do not uniformly bias the free layer. The end portions of the free layer can become over-biased and do not properly respond to magnetic fields from the magnetic disk.

Another method used to stabilize the magnetic moment of the free layer is to bias the free layer using an in-stack biasing layer structure. The in-stack biasing layer structure includes a pinned bias layer and a pinning bias layer separated from the free layer by a spacer layer. The pinning bias layer is comprised of antiferromagnetic (AFM) material, such as IrMn. The pinned bias layer has a magnetization pinned by exchange coupling with the AFM pinning bias layer. The AFM pinning bias layer is generally thick, on the order of 75 Å or more.

To set the magnetic moment of the pinned layer (assuming this layer is set first), heat (such as 270° C.) and a strong magnetic field are applied to set the magnetic moment of this layer perpendicular to the ABS of the recording head by exchange coupling with the AFM pinning layer. To subsequently set the magnetic moment of the pinned bias layer, heat and a strong magnetic field are again applied to pin the magnetic moment of this layer longitudinal to the ABS and parallel to the major planes of the layers of the read element by exchange coupling with the AFM pinning bias layer.

One problem with setting the magnetic moment of two AFM layers in the read element stack is that, while applying heat and a strong magnetic field to set the second AFM layer (the AFM pinning bias layer in the above example), the setting of the first AFM layer may be negatively affected. In the above example, the AFM pinning layer and the AFM pinning bias layer are to be set orthogonal to one another. Setting the AFM pinning bias layer orthogonal to the AFM pinning layer under heat can change the magnetization of the AFM pinning layer. Setting the magnetization of two AFM layers can cause problems for recording head designers.

SUMMARY OF THE SOLUTION

The invention solves the above and other related problems with a magnetoresistive (MR) element, such as an MR read element for a recording head, having a pinning layer formed from a permanent magnetic material, such as CoPt or CoPtCr. The magnetic moment of a permanent magnetic material may be set using a strong magnetic field at room temperature or at another temperature much lower than the temperature used for setting the magnetization of AFM material. Therefore, in an MR element stack having one pinning layer formed from an AFM material and one pinning layer formed from a permanent magnetic material, the magnetic moment of the permanent magnetic material can advantageously be set without applying high temperatures. The process of setting the magnetic moment of the permanent magnetic material thus has a reduced chance of negatively affecting the magnetic moment of an AFM layer that has already been set.

In one embodiment, the MR element includes a first pinning layer, a first pinned layer, a first spacer/barrier layer, a free layer, a second spacer/barrier layer, a second pinned layer, and a second pinning layer. One of the first pinning layer or the second pinning layer is formed from a permanent magnetic material, such as CoPt or CoPtCr. The other of the first pinning layer or the second pinning layer is formed from an antiferromagnetic (AFM) material, such as IrMn or PtMn. By using permanent magnetic material for one of the pinning layers, the magnetic moment of the pinning layer formed from the permanent magnetic material may be set using a strong magnetic field at room temperature. Since a permanent magnetic pinning layer can be made thinner than an AFM pinning layer, it reduces the total stack thickness to achieve smaller shield-to-shield spacing for higher read resolution. Also, a permanent magnetic pinning layer has lower electrical resistivity than an AFM pinning layer, which contributes to smaller parasitic resistance and larger dR/R for the MR element.

In another embodiment of the invention, the MR element further includes a seed layer that is sandwiched between the second pinning layer and a shield. The seed layer has multiple functions. First, the seed layer defines the crystallographic texture or grain size of the second pinning layer. Second, the seed layer acts as a buffer between the shield and the second pinning layer. The seed layer includes a layer of amorphous material, such as NiTa or Ta, which acts to buffer the shield from changing or affecting the crystallographic texture or grain size of the second pinning layer.

The invention may include other exemplary embodiments described below.

DESCRIPTION OF THE DRAWINGS

The same reference number represents the same element on all drawings.

FIG. 1 illustrates a magnetic disk drive system in an exemplary embodiment of the invention.

FIG. 2 illustrates a recording head in an exemplary embodiment of the invention.

DETAILED DESCRIPTION OF THE INVENTION

Figure 3:
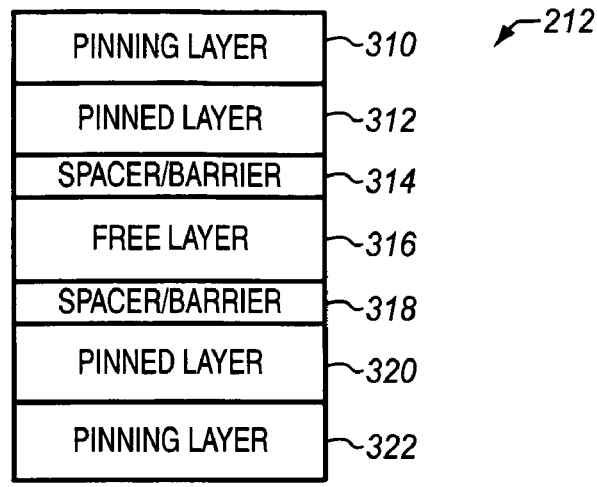
FIG. 3 illustrates a partial composition of a read element in an exemplary embodiment of the invention.

FIGS. 1-6 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

FIG. 1 illustrates a magnetic disk drive system 100 in an exemplary embodiment of the invention. Magnetic disk drive system 100 includes a spindle 102, a magnetic disk 104, a motor controller 106, an actuator 108, an actuator arm 110, a suspension arm 112, and a recording head 114. Spindle 102 supports and rotates a magnetic disk 104 in the direction indicated by the arrow. A spindle motor (not shown) rotates spindle 102 according to control signals from motor controller 106. Recording head 114 is supported by suspension arm 112 and actuator arm 110. Actuator arm 110 is connected to actuator 108 that is configured to rotate in order to position recording head 114 over a desired track of magnetic disk 104. Magnetic disk drive system 100 may include other devices, components, or systems not shown in FIG. 1. For instance, a plurality of magnetic disks, actuators, actuator arms, suspension arms, and recording heads may be used.

When magnetic disk 104 rotates, an air flow generated by the rotation of magnetic disk 104 causes an air bearing surface (ABS) of recording head 114 to ride on a cushion of air a particular height above magnetic disk 104. The height depends on the shape of the ABS. As recording head 114 rides on the cushion of air, actuator 108 moves actuator arm 110 to position a magnetoresistive (MR) read element (not shown) and a write element (not shown) in recording head 114 over selected tracks of magnetic disk 104.

FIG. 2 illustrates recording head 114 in an exemplary embodiment of the invention. The view of recording head 114 is of the ABS side of recording head 114. Recording head 114 has a cross rail 202, two side rails 204-205, and a center rail 206 on the ABS side. The rails on recording head 114 illustrate just one embodiment, and the configuration of the ABS side of recording head 114 may take on any desired form. Recording head 114 also includes a write element 210 and a magnetoresistive (MR) read element 212 on a trailing edge 214 of recording head 114.

FIG. 3 illustrates a partial composition of MR read element 212 in an exemplary embodiment of the invention. The view of FIG. 3 is from the ABS of recording head 114. Read element 212 may be a current in plane (CIP) read element or a current perpendicular to the planes (CPP) read element. FIG. 3 is just an illustration of one embodiment, and read element 212 may include other layers, such as a cap layer, a seed layer, shields, etc.

Although FIG. 3 applies to an MR read element 212 for a magnetic disk drive system, the teaching herein applies equally to any MR element.

Read element 212 includes a first pinning layer 310, a first pinned layer 312, a first spacer/barrier layer 314, a free layer 316, a second spacer/barrier layer 318, a second pinned layer 320, and a second pinning layer 322. One of the first pinning layer 310 or the second pinning layer 322 is formed from a permanent magnetic material, such as CoPt or CoPtCr. The other of the first pinning layer 310 or the second pinning layer 322 is formed from an antiferromagnetic (AFM) material, such as IrMn or PtMn.

The first pinned layer 312 and the second pinned layer 320 may have multiple desired configurations. In one embodiment, the first pinned layer 312 may be comprised of a layer of ferromagnetic material, such as CoFe. In another embodiment, the first pinned layer 312 may be comprised of a two ferromagnetic layers (such as CoFe) separated by an antiparallel coupling (APC) layer, such as Ru. The second pinned layer 320 may have similar configurations as described for the first pinned layer 312.

The free layer 316 may have multiple desired configurations. In one embodiment, free layer 316 is comprised of two layers of ferromagnetic layers, such as a first layer of CoFe and second layer of NiFe. In another embodiment, free layer 316 is comprised of three layers of ferromagnetic material, such as a first layer of CoFe, a second layer of NiFe, and a third layer of CoFe.

Spacer/barrier layer 314 and spacer/barrier layer 318 may comprise a spacer layer or a barrier layer depending on the desired configuration of read element 212. A spacer layer is known to those skilled in the art as a layer of non-magnetic material between a pinned layer and a free layer. The spacer layer may contribute to, spin-dependent scattering, such as a spacer layer between a traditional pinned layer and the free layer. A spacer layer that contributes to spin-dependent scattering may be formed from Cu, Au, or Ag. The spacer layer may not contribute to spin-dependent scattering, such as a spacer layer between an in-stack biasing pinned layer and the free layer. A spacer layer that does not contribute to spin-dependent scattering may be formed from Ru. A barrier layer is known to those skilled in the art as a thin layer of insulating material, such as $Al_2O_3$ or MgO that allows for quantum-mechanical tunneling of charge carriers. As an example configuration, if read element 212 comprises a giant magnetoresistive (GMR) read element, then spacer/barrier layer 314 and spacer/barrier layer 320 comprise spacer layers. If read element 212 comprises a magnetic tunnel junction (MTJ) read element, then one or both of spacer/barrier layer 314 and spacer/barrier layer 320 comprise barrier layers.

The composition of this embodiment of read element 212 allows for multiple configurations. In one configuration, the first pinning layer 310 and the first pinned layer 312 operate as in-stack biasing layers to bias the free layer 316. The first pinning layer 310 pins the magnetic moment of the first pinned layer 312 parallel to the ABS and parallel to the major planes of the layers of read element 212. The first pinned layer 312 longitudinally biases the magnetic moment of the free layer 316. In this configuration, the second pinning layer 322 and the second pinned layer 320 operate as traditional pinning and pinned layers. The second pinning layer 322 pins the magnetic moment of the second pinning layer 320 perpendicular to the ABS of the recording head 212 or perpendicular to the free layer 316 when the free layer 316 is in a quiescent bias state (no applied external magnetic fields). As previously stated, one of the first pinning layer 310 or the second pinning layer 322 is formed from a permanent magnetic material.

In another configuration, the read element 212 comprises a dual sensor, meaning that read element 212 has two traditional pinning and pinned layers. The first pinning layer 310 pins the magnetic moment of the first pinned layer 312 perpendicular to the ABS or perpendicular to the free layer 316 when the free layer 316 is in a quiescent bias state. Similarly, the second pinning layer 322 pins the magnetic moment of the second pinning layer 320 perpendicular to the ABS or perpendicular to the free layer 316 when the free layer 316 is in a quiescent bias state. Hard biasing of the free layer 316 may be used for this configuration to bias the free layer 316. As with the other configuration, one of the first pinning layer 310 or the second pinning layer 322 is formed from a permanent magnetic material.

There may be other configurations allowed by the read element 212 described in FIG. 3.

The read element 212 shown in FIG. 3 provides advantages over prior read elements. For prior read elements having two pinning layers, these prior read elements use AFM for both of the pinning layers. Read element 212 according to the invention uses permanent magnetic material for one of the pinning layers and AFM for the other pinning layer. By using permanent magnetic material for one of the pinning layers, the magnetic moment of the pinning layer formed from the permanent magnetic material may be set using a strong magnetic field at room temperature. The magnetic moment of the pinning layer formed from the permanent magnetic material is set substantially orthogonal to the magnetic moment of the pinning layer formed from the AFM magnetic material without affecting the magnetic moment of the AFM layer. Also, the setting of the permanent magnetic pinning layer can be combined with the setting of the track edge permanent magnetic usually used for stabilizing the free layer. It may require a canted external field to set both track edge magnets and the permanent magnetic pinning layer simultaneously.

Figure 4:
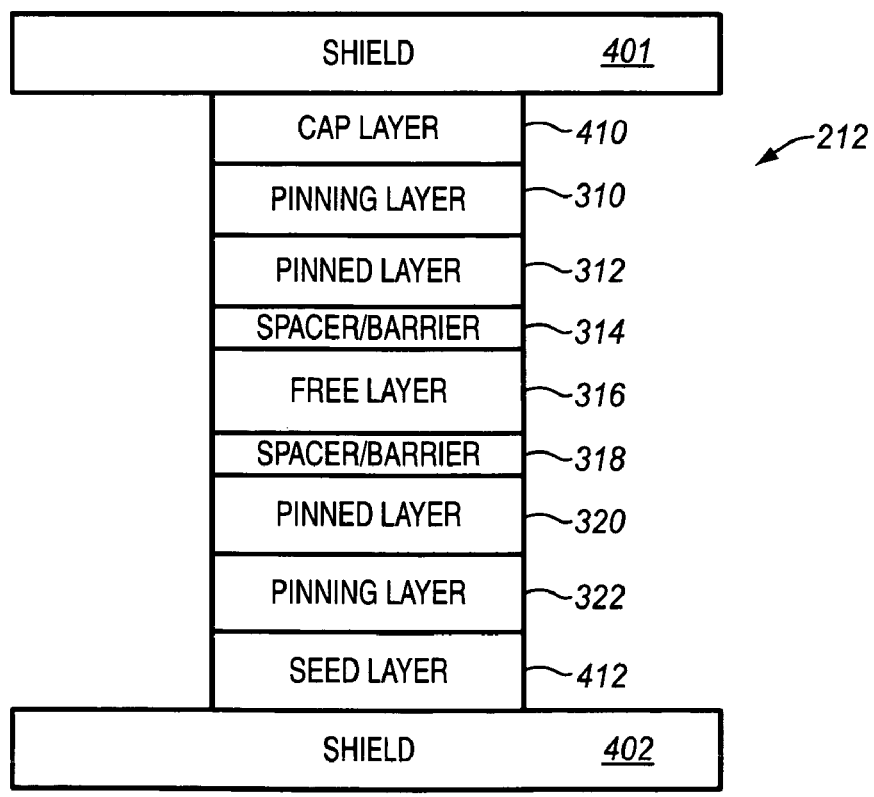
FIG. 4 illustrates another partial composition of the read element of FIG. 3 in an exemplary embodiment of the invention.

FIG. 4 illustrates another embodiment of read element 212 sandwiched between a pair of shields 401-402. In this embodiment, read element 212 further includes a cap layer 410 and a seed layer 412. Cap layer 410 is sandwiched between shield 401 and the first pinning layer 310. Seed layer 412 is sandwiched between shield 402 and the second pinning layer 322. Seed layer 412 has multiple functions. First, seed layer 412 defines the crystallographic texture or grain size of the second pinning layer 322. Second, seed layer 412 acts as a buffer between shield 402 and the second pinning layer 322. Seed layer 412 includes a layer of amorphous material that acts to buffer shield 402 from changing or affecting the crystallographic texture or grain size of the second pinning layer 322. Seed layer 412 may be a single layer, bi-layer, or multi-layer. For instance, seed layer 412 may include a first layer of Cr and a second layer of NiTa or Ta.

Figure 5:
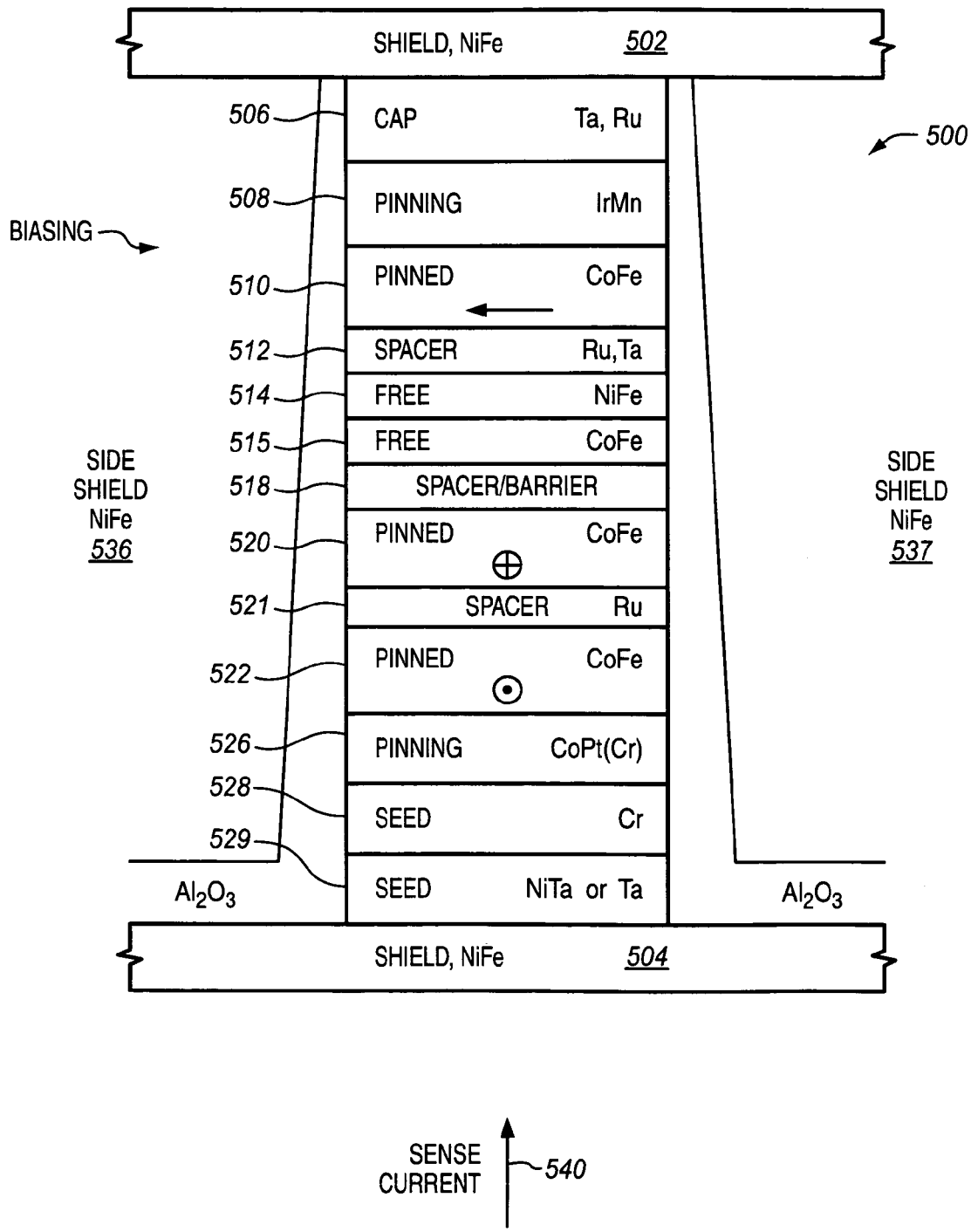
FIG. 5 illustrates another read element in an exemplary embodiment of the invention.

FIG. 5 illustrates a read element 500 in a recording head in an exemplary embodiment of the invention. The view of read element 500 is from an ABS side of the recording head (not shown) that includes read element 500. Read element 500 may illustrate one embodiment of read element 212 shown in FIGS. 3-4, but read element 212 is not limited to the structure of read element 500. The layer materials described for read element 500 are just one example and other equivalent materials may be used for the layers.

Read element 500 is sandwiched between shield layers 502, 504. Shield layers 502, 504 are formed from NiFe. Read element 500 in this embodiment includes a cap layer 506 formed from a material such as Ta or Ru. Cap layer 506 is adjacent to shield layer 502 to protect other layers from subsequent processing steps.

Read element 500 further includes a first pinning layer 508. The first pinning layer 508 is adjacent to cap layer 506 and is formed from an antiferromagnetic (AFM) material, such as IrMn.

Read element 500 further includes a first pinned layer 510 adjacent to the first pinning layer 508. In this embodiment, the first pinned layer 510 is formed from a ferromagnetic material, such as CoFe. The first pinning layer 508 is exchange coupled to the first pinned layer 510 to pin the magnetic moment of the first pinned layer 510 parallel to the ABS of the recording head. The magnetic moment of the first pinned layer 510 is illustrated as an arrow.

Read element 500 further includes a spacer layer 512, a free layer 514-515, and a spacer/barrier layer 518. Spacer layer 512 is adjacent to the first pinned layer 510 and is formed from Ru, Ta, or a similar material. Free layer 514-515 is adjacent to spacer layer 512. Spacer/barrier layer 518 is adjacent to free layer 514-515. Spacer/barrier layer 518 may comprise a spacer layer or a barrier layer depending on whether read element 500 is a GMR read element or an MTJ read element. If read element 500 comprises a GMR read element, then spacer/barrier layer 518 is formed from Cu, Au, or Ag. If read element 500 comprises an MTJ read element, then spacer/barrier layer 518 is formed from a thin layer of $Al_2O_3$ or MgO. The free layer 514-515 is comprised of two layers in this embodiment. The free layer 514-515 comprises a first layer 514 of NiFe, and a second layer 515 of CoFe.

Read element 500 further includes a second pinned layer 520-522. The second pinned layer 520-522 is adjacent to spacer/barrier layer 518. In this embodiment, the second pinned layer 520-522 comprises a first ferromagnetic pinned layer 520 formed from CoFe and a second ferromagnetic pinned layer 522 formed from CoFe separated by a spacer layer 521 formed from Ru.

Read element 500 further includes a second pinning layer 526. The second pinning layer 526 is formed from a permanent magnetic material in this embodiment. The permanent magnetic material may be CoPt, CoPtCr, or another equivalent material. The second pinning layer 526 is exchange coupled to pinned layers 520, 522 to pin the magnetic moments of pinned layers 520, 522 perpendicular to the ABS of the recording head. The magnetic moments of pinned layers 520, 522 are illustrated as an arrow tail and an arrow point, respectively.

Read element 500 further includes a seed layer 528-529. The seed layer 528-529 is adjacent to the second pinning layer 526. The seed layer 528-529 includes a first layer 528 of Cr and a second layer 529 of NiTa or Ta. The Cr layer 528 defines the crystallographic texture or grain size of the second pinning layer 526. The NiTa or Ta layer 529 acts as a buffer between shield 504 and the second pinning layer 526. The NiTa or Ta layer 529 is an amorphous material that acts to buffer shield 504 from changing or affecting the crystallographic texture or grain size of the second pinning layer 526.

Insulating layers formed from $Al_2O_3$ are on either side of read element 500. A first side shield layer 536 and a second side shield layer 537 are located on either side of the read element 500 separated by the insulating layer. Side shield layers 536-537 are formed from NiFe.

In this embodiment, the AFM pinning layer 508 and the pinned layer 510 operate to bias the free layer 514-515. The AFM pinning layer 508 is exchange coupled with pinned layer 510 to fix the magnetic moment of the pinned layer 510 parallel to the ABS of the recording head (see arrow). The pinned layer 510 longitudinally biases the magnetic moment of free layer 514-515 parallel to the ABS and parallel to the major planes of the layers of read element 500.

The permanent magnetic pinning layer 526 operates as a traditional pinning layer to enhance the MR signal of the read element 500. The permanent magnetic pinning layer 526 is exchange coupled with pinned layer 522 to pin the magnetic moment perpendicular to the ABS. The pinned layer 520 is antiparallel exchange coupled with the pinned layer 522 because of the selected thickness of the spacer layer 521 between the pinned layers 520, 522. Accordingly, the magnetization of pinned layer 520 is antiparallel to the direction of the magnetization of pinned layer 522.

The following lists example thicknesses and widths of the layers of read element 500. Shield layers 502, 504 are about one micron thick. Cap layer 506 is about 40 Å, pinning layer 508 is about 75 Å, pinned layer 510 is about 20 Å, spacer layer 512 is about 20 Å, free layer 514 is about 20 Å, and free layer 515 is about 20 Å thick. If spacer/barrier layer 518 comprises a spacer layer (such as Cu), then spacer/barrier layer 518 is about 20 Å thick. If spacer/barrier layer 518 comprises a barrier layer, then spacer/barrier layer 518 is about 5 Å thick. Pinned layer 520 is about 20 Å, spacer layer 521 is about 4 Å, pinned layer 522 is about 20 Å, pinning layer 526 is about 50 Å, seed layer 528 is about 30 Å, and seed layer 530 is about 10-20 Å thick. These layers have a width of about 50 nm.

Shield layers 502, 504 provide electrical connections for flow of a sense current 540 from a current source (not shown) to read element 500. Sense current 540 may be conducted through read element 500 from bottom to top, as shown in FIG. 5, or from top to bottom. Due to the direction of sense current 540 through read element 500, read element 500 is considered a current perpendicular to the planes (CPP) read element. If a magnetic field from a rotating magnetic disk rotates the magnetic moment of free layer 514-515 to be more antiparallel to a magnetic moment of pinned layers 520, 522, then the resistance of read element 500 increases. If a magnetic field from the rotating magnetic disk rotates the magnetic moment of free layer 514-515 to be more parallel to a magnetic moment of pinned layers 520, 522, then the resistance of read element 500 decreases.

Read element 500 may be fabricated in a magnetron sputtering or an ion beam sputtering system to sequentially deposit the multilayer structure shown in FIG. 5. After fabrication, the magnetic moment of the pinning layer 508 and the magnetic moment of the pinning layer 526 are set as follows. The pinned layer 510 magnetization is set at wafer level by exchange coupling to the AFM pinning layer 508. Magnetic annealing at around 240° C. for about five hours in a field of about 1 T is done to establish exchange coupling. The permanent magnetic pinning layer 526 magnetization is set at head level using a high field (>1 T) with a field oriented perpendicular to the plane of the air bearing surface and substantially orthogonal to the magnetization of the AFM pinning layer 508.

Figure 6:
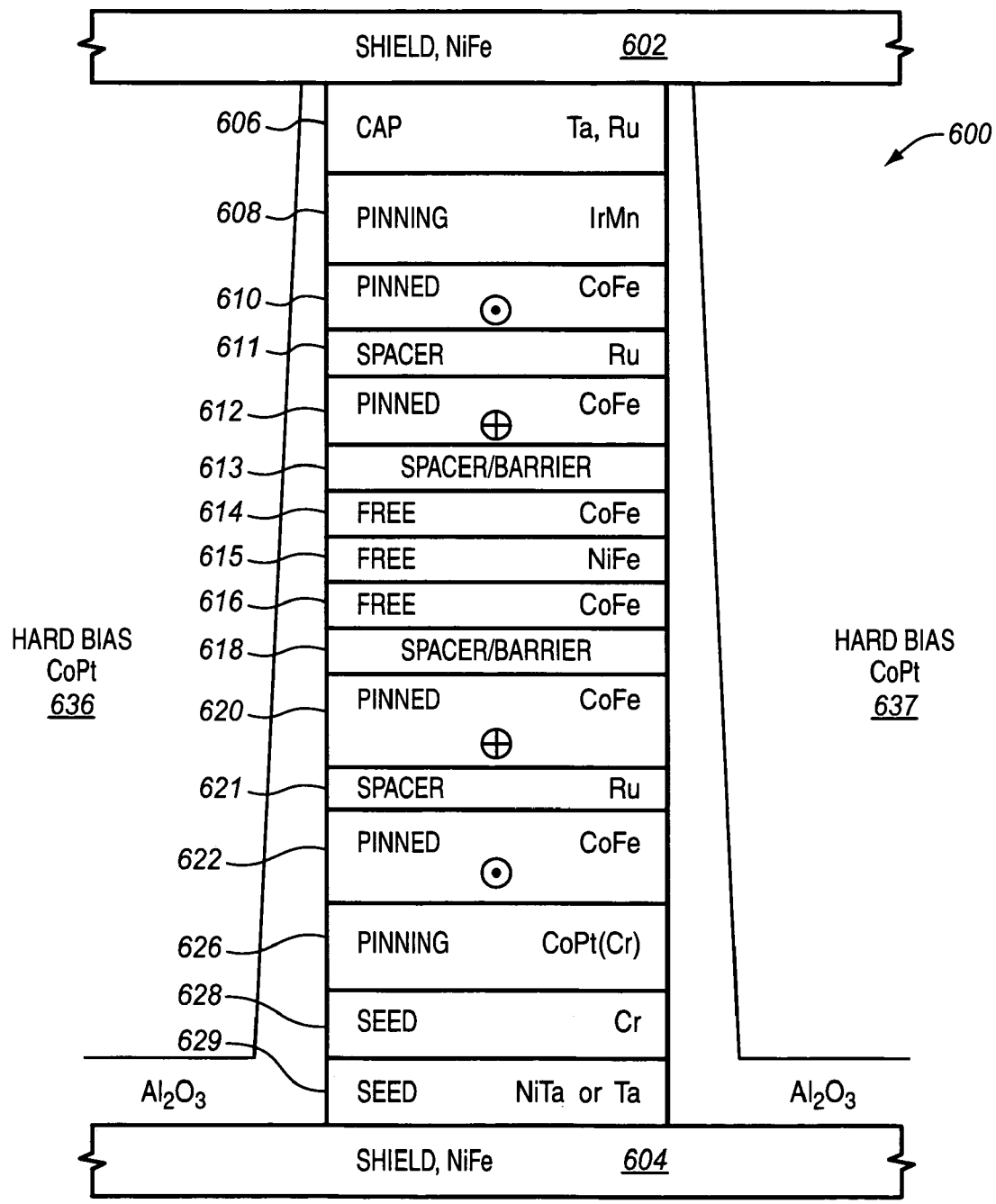
FIG. 6 illustrates another read element in an exemplary embodiment of the invention.

FIG. 6 illustrates a read element 600 in a recording head in another exemplary embodiment of the invention. The view of read element 600 is from an ABS side of the recording head (not shown) that includes read element 600. Read element 600 may illustrate one embodiment of read element 212 shown in FIGS. 3-4, but read element 212 is not limited to the structure of read element 600. The layer materials described for read element 600 are just one example and other equivalent materials may be used for the layers.

Read element 600 is sandwiched between shield layers 602, 604. Shield layers 602, 604 are formed from NiFe. Read element 600 in this embodiment includes a cap layer 606 formed from a material such as Ta or Ru. The cap layer 606 is adjacent to shield layer 602 to protect other layers from subsequent processing steps.

Read element 600 further includes a first pinning layer 608 adjacent to cap layer 606. The first pinning layer 608 is formed from an AFM material, such as IrMn.

Read element 600 further includes a first pinned layer 610-612 adjacent to the first pinning layer 608. In this embodiment, the first pinned layer 610-612 comprises a first ferromagnetic pinned layer 610 formed from CoFe and a second ferromagnetic pinned layer 612 formed from CoFe separated by a spacer layer 611 formed from Ru. The first pinning layer 608 is exchange coupled to pinned layers 610, 612 to pin the magnetic moments of pinned layers 610, 612 perpendicular to the ABS of the recording head. The magnetic moments of pinned layers 610, 612 are illustrated as an arrow tail and an arrow point, respectively.

Read element 600 further includes a first spacer/barrier layer 613, a free layer 614-616, and a second spacer/barrier layer 618. Spacer/barrier layer 613 is adjacent to the first pinned layer 610-612. Free layer 614-616 is adjacent to spacer/barrier layer 613. Spacer/barrier layer 618 is adjacent to free layer 614-616. Spacer/barrier layer 613 and spacer/barrier layer 618 may comprise a spacer layer or a barrier layer depending on whether read element 600 is a GMR read element or an MTJ read element. The free layer 614-616 is comprised of three layers in this embodiment. The free layer 614-616 comprises a first layer 614 of NiFe, a second layer 615 of CoFe, and a third layer 616 of NiFe.

Read element 600 further includes a second pinned layer 620-622. The second pinned layer 620-622 is adjacent to spacer/barrier layer 618. In this embodiment, the second pinned layer 620-622 comprises a first ferromagnetic pinned layer 620 formed from CoFe and a second ferromagnetic pinned layer 622 formed from CoFe separated by a spacer layer 621 formed from Ru.

Read element 600 further includes a second pinning layer 626. The second pinning layer 626 is formed from a permanent magnetic material in this embodiment. The permanent magnetic material may be CoPt, CoPtCr, or another equivalent material. The second pinning layer 626 is exchange coupled to pinned layers 620, 622 to pin the magnetic moments of pinned layers 620, 622 perpendicular to the ABS of the recording head. The magnetic moments of pinned layers 620, 622 are illustrated as an arrow tail and an arrow point, respectively.

Read element 600 further includes a seed layer 628-629. The seed layer 628-629 is adjacent to the second pinning layer 626. The seed layer 628-629 includes a first layer 628 of Cr and a second layer 629 of NiTa or Ta. The Cr layer 628 defines the crystallographic texture or grain size of the second pinning layer 626. The NiTa or Ta layer 629 acts as a buffer between shield 604 and the second pinning layer 626. The NiTa or Ta layer 629 is an amorphous material that acts to buffer shield 604 from changing or affecting the crystallographic texture or grain size of second pinning layer 626.

Insulating layers formed from $Al_2O_3$ are on either side of read element 600. A first hard bias magnetic layer 636 and a second hard bias magnetic layer 637 are located on either side of the read element 600 separated by the insulating layers. The hard bias magnetic layers 636-637 are formed from CoPt. The hard bias magnetic layers 636-637 operate to longitudinally bias the magnetic moment of the free layer 614-616 parallel to the ABS and parallel to the major planes of the layers of read element 600.

In this embodiment, the AFM pinning layer 608 and the permanent magnetic pinning layer 626 both operate as traditional pinning layers. Therefore, read element 600 has a dual sensor structure. The dual sensor structure enhances dR/R. The reduced parasitic resistance contribution from permanent magnetic pinning layer 626 further enhances dR/R. Also, permanent magnetic pinning layer 626 is thinner which allows for a thinner read element stack. In addition, it is possible to use a nano-oxide layer inside spacer layers 613, 618 to enhance dR further without running into a spin torque noise limit.

Shield layers 602, 604 provide electrical connections for flow of a sense current 640 from a current source (not shown) to read element 600. Sense current 640 may be conducted through read element 600 from bottom to top, as shown in FIG. 6, or from top to bottom. Due to the direction of sense current 640 through read element 600, read element 600 is considered a CPP read element.

Although specific embodiments were described herein, the scope of the invention is not limited to those specific embodiments. The scope of the invention is defined by the following claims and any equivalents thereof.

I claim:

1. A magnetoresistive (MR) element, comprising:
   a first pinning layer;
   a first pinned layer;
   a first spacer/barrier layer;
   a free layer;
   a second spacer/barrier layer;
   a second pinned layer; and
   a second pinning layer;
   wherein one of the first pinning layer and the second pinning layer is formed from a permanent magnetic material and the other of the first pinning layer and the second pinning layer is formed from an antiferromagnetic (AFM) material.

2. The MR element of claim 1 wherein the permanent magnetic material comprises one of CoPt or CoPtCr.

3. The MR element of claim 1 further comprising a seed layer of an amorphous material between a shield layer and the second pinning layer, wherein the second pinning layer is formed from the permanent magnetic material.

4. The MR element of claim 3 wherein the seed layer comprises one of NiTa or Ta.

5. The MR element of claim 1 wherein the magnetic moment of the pinning layer formed from the AFM material is set substantially orthogonal to the magnetic moment of the pinning layer formed from the permanent magnetic material.

6. The MR element of claim 1 wherein the MR element comprises a current perpendicular to the planes (CPP) MR element.

7. The MR element of claim 1 wherein:
the first pinning layer and the first pinned layer operate to bias the free layer.

8. The MR element of claim 1 wherein:
the first pinning layer is operable to pin the magnetic moment of the first pinned layer perpendicular to the free layer when in a quiescent bias state.

9. A recording head of a magnetic disk drive system, the recording head comprising:
a magnetoresistive (MR) read element operable to read data from a magnetic disk of the magnetic disk drive system, the MR read element comprising:
a first pinning layer;
a first pinned layer;
a first spacer/barrier layer;
a free layer;
a second spacer/barrier layer;
a second pinned layer; and
a second pinning layer;
wherein one of the first pinning layer and the second pinning layer is formed from a permanent magnetic material and the other of the first pinning layer and the second pinning layer is formed from an antiferromagnetic (AFM) material.

10. The recording head of claim 9 wherein the permanent magnetic material comprises one of CoPt and CoPtCr.

11. The recording head of claim 9 further comprising a seed layer of an amorphous material between a shield layer and the second pinning layer, wherein the second pinning layer is formed from the permanent magnetic material.

12. The recording head of claim 11 wherein the seed layer comprises one of NiTa or Ta.

13. The recording head of claim 9 wherein the MR read element comprises a current perpendicular to the planes (CPP) read element.

14. The recording head of claim 9 wherein the magnetic moment of the pinning layer formed from the AFM material is set substantially orthogonal to the magnetic moment of the pinning layer formed from the permanent magnetic material.

15. The recording head of claim 9 wherein the first pinning layer and the first pinned layer are operable to bias the free layer.

16. The recording head of claim 15 wherein the free layer comprises:
a first layer of NiFe; and
a second layer of CoFe.

17. The recording head of claim 15 further comprising:
a first side shield;
a first insulation layer between the first side shield and a first side of the read element;
a second side shield; and
a second insulation layer between the second side shield and a second side of the read element.

18. The recording head of claim 9 wherein:
the first pinning layer is operable to pin the magnetic moment of the first pinned layer perpendicular to the air bearing surface (ABS) of the recording head; and
the second pinning layer is operable to pin the magnetic moment of the second pinned layer perpendicular to the air bearing surface (ABS) of the recording head.

19. The recording head of claim 18 wherein the free layer comprises:
a first layer of CoFe;
a second layer of NiFe; and
a third layer of CoFe.

20. The recording head of claim 18 further comprising:
a first side hard bias magnetic layer;
a first insulation layer between the first side hard bias magnetic layer and a first side of the read element;
a second side hard bias magnetic layer; and
a second insulation layer between the second side hard bias magnetic layer and a second side of the read element.

21. A magnetic disk drive system, comprising:
a magnetic disk; and
a recording head having a magnetoresistive (MR) read element operable to read data from the magnetic disk, the MR read element comprising:
a first pinning layer;
a first pinned layer;
a first spacer/barrier layer;
a free layer;
a second spacer/barrier layer;
a second pinned layer; and
a second pinning layer;
wherein one of the first pinning layer and the second pinning layer is formed from a permanent magnetic material and the other of the first pinning layer and the second pinning layer is formed from an antiferromagnetic (AFM) material.

22. The magnetic disk drive system of claim 21 wherein the permanent magnetic material comprises one of CoPt or CoPtCr.

23. The magnetic disk drive system of claim 21 wherein the recording head further comprises:
a cap layer adjacent the first pinning layer;
a first shield adjacent to the cap layer;
a seed layer formed from an amorphous material adjacent the second pinning layer; and
a second shield adjacent to the seed layer.

24. The magnetic disk drive system of claim 23 wherein the seed layer comprises one of NiTa or Ta.

25. The magnetic disk drive system of claim 21 wherein the magnetic moment of the pinning layer formed from the AFM material is set substantially orthogonal to the magnetic moment of the pinning layer formed from the permanent magnetic material.

26. The magnetic disk drive system of claim 21 wherein the MR read element comprises a current perpendicular to the planes (CPP) read element.

27. The magnetic disk drive system of claim 21 wherein the first pinning layer and the first pinned layer are operable to bias the free layer.

28. The magnetic disk drive system of claim 27 wherein the free layer comprises:
a first layer of NiFe; and
a second layer of CoFe.

29. The magnetic disk drive system of claim 27 further comprising:
a first side shield;
a first insulation layer between the first side shield and a first side of the read element;
a second side shield; and
a second insulation layer between the second side shield and a second side of the read element.

30. The magnetic disk drive system of claim 21 wherein:
the first pinning layer is operable to pin the magnetic moment of the first pinned layer perpendicular to the air bearing surface (ABS) of the recording head; and
the second pinning layer is operable to pin the magnetic moment of the second pinned layer perpendicular to the air bearing surface (ABS) of the recording head.

31. The magnetic disk drive system of claim 30 wherein the free layer comprises:
   a first layer of CoFe;
   a second layer of NiFe; and
   a third layer of CoFe.

32. The magnetic disk drive system of claim 30 further comprising:
   a first side hard bias magnetic layer;
   a first insulation layer between the first side hard bias magnetic layer and a first side of the read element;
   a second side hard bias magnetic layer; and
   a second insulation layer between the second side hard bias magnetic layer and a second side of the read element.

* * * * *